US011994888B2

(12) United States Patent
Abhishek et al.

(10) Patent No.: US 11,994,888 B2
(45) Date of Patent: May 28, 2024

(54) POWER SUPPLY HANDLING FOR MULTIPLE PACKAGE CONFIGURATIONS

(71) Applicant: NXP USA, Inc., Austin, TX (US)

(72) Inventors: Kumar Abhishek, Bee Cave, TX (US); Sandeep Singh Jasrotia, Noida (IN)

(73) Assignee: NXP USA, Inc., Austin, TX (US)

( * ) Notice: Subject to any disclaimer, the term of this patent is extended or adjusted under 35 U.S.C. 154(b) by 0 days.

(21) Appl. No.: 18/048,879

(22) Filed: Oct. 24, 2022

(65) Prior Publication Data

US 2024/0019883 A1 Jan. 18, 2024

(30) Foreign Application Priority Data

Jul. 18, 2022 (IN) .............................. 202211040968

(51) Int. Cl.
*H03K 3/037* (2006.01)
*G05F 1/56* (2006.01)

(52) U.S. Cl.
CPC .............. *G05F 1/56* (2013.01); *H03K 3/037* (2013.01)

(58) Field of Classification Search
None
See application file for complete search history.

(56) References Cited

U.S. PATENT DOCUMENTS

| 4,307,306 | A | 12/1981 | Kucharewski | |
|---|---|---|---|---|
| 6,885,232 | B2 | 4/2005 | Chonan | |
| 7,687,858 | B2 * | 3/2010 | Woo | H03J 3/08 257/357 |
| 8,022,727 | B2 * | 9/2011 | Koutsoures | H03K 19/1731 326/82 |
| 8,543,856 | B2 | 9/2013 | Singh et al. | |
| 8,884,702 | B2 * | 11/2014 | Afsahi | H03F 3/245 330/296 |
| 8,912,847 | B2 * | 12/2014 | Spits | H03F 3/24 330/126 |
| 8,970,460 | B2 * | 3/2015 | Yaguma | G09G 3/3696 345/87 |
| 9,476,937 | B2 * | 10/2016 | Sharda | G01R 31/31705 |
| 11,355,046 | B2 * | 6/2022 | Guan | G09G 3/20 |
| 2017/0294909 | A1 * | 10/2017 | Bartling | H03K 19/018592 |
| 2023/0343372 | A1 * | 10/2023 | Yap | H03K 19/01742 |

FOREIGN PATENT DOCUMENTS

EP 0573965 A2 12/1993

\* cited by examiner

*Primary Examiner* — Thomas J. Hiltunen
(74) *Attorney, Agent, or Firm* — Joanna G. Geld (57) ABSTRACT

A packaged die including a first and a second power supply pad configured to provide a first and a second power supply voltage, respectively, and circuitry powered by the first power supply voltage. A power pad handling circuitry includes a selectively enablable pull-down path coupled between the first power supply pad and the second power supply pad, a storage circuit configured to store a pull-down path enable bit, a clock input coupled to receive a boot clock, and an asynchronous input coupled to receive a power-on-reset (POR) signal. In response to assertion of the POR signal, the pull-down pat is enabled regardless of any signal received at the clock input and regardless the value of the pull-down path enable bit. When reset has completed, a value of the pull-down path enable bit is provided upon an active edge of the boot clock to selectively enable the pull-down path.

18 Claims, 10 Drawing Sheets

POWER SUPPLY HANDLING FOR MULTIPLE PACKAGE CONFIGURATIONS

CROSS-REFERENCE TO RELATED APPLICATIONS

This application claims the priority under 35 U.S.C. § 119 of India application no. 202211040968, filed on 18 Jul. 2022, the contents of which are incorporated by reference herein.

BACKGROUND

Field

This disclosure relates generally to packaged integrated circuits, and more specifically, to power supply handling circuit for use with multiple package configurations.

Related Art

Microcontrollers are typically offered with multiple package configurations in order to suit different applications. On many occasions, pins are double bonded for multiple functionality. In general, it is only the signal pins which are multiplexed for the multiple functionalities. However, in some applications, different power supply interfaces are needed depending on the application, requiring power supply pads of a die to either be bonded out to the package or left unbonded to the package. For example, using different package configurations, Low Voltage Differential Signaling (LVDS) or General Purpose Input/Outs (GPIOs) can be implemented on the same pins, in which power supply pads can be bonded or left unbonded, depending on the application of the packaged device. Unbonded power supply pads, though, result in floating power supplies which can lead to reliability issues inside the die as they may couple to any voltage level or create short circuit currents. Therefore, a need exists for a circuit which safely handles power supply pads across different package configuration.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

In one aspect, a power supply handling circuit within a packaged die provides an internal pull-down path for any unbonded or unused power supply pins based on the package configuration. The package configuration can be programmed as a package decode bit in a non-volatile memory (NVM) of the packaged die to indicate the package configuration to the power supply handling circuit. In one embodiment, the power supply handling circuit also ensures that unbonded or unused power supply pads are safely pulled down during reset, prior to being able to read the NVM to determine the package configuration. In another embodiment, the power supply handling circuit also interfaces with a lower power mode (LPM) state machine in order to safely control the unbonded power supply pads during LPM or upon entering or exiting the LPM.

Figure 1:
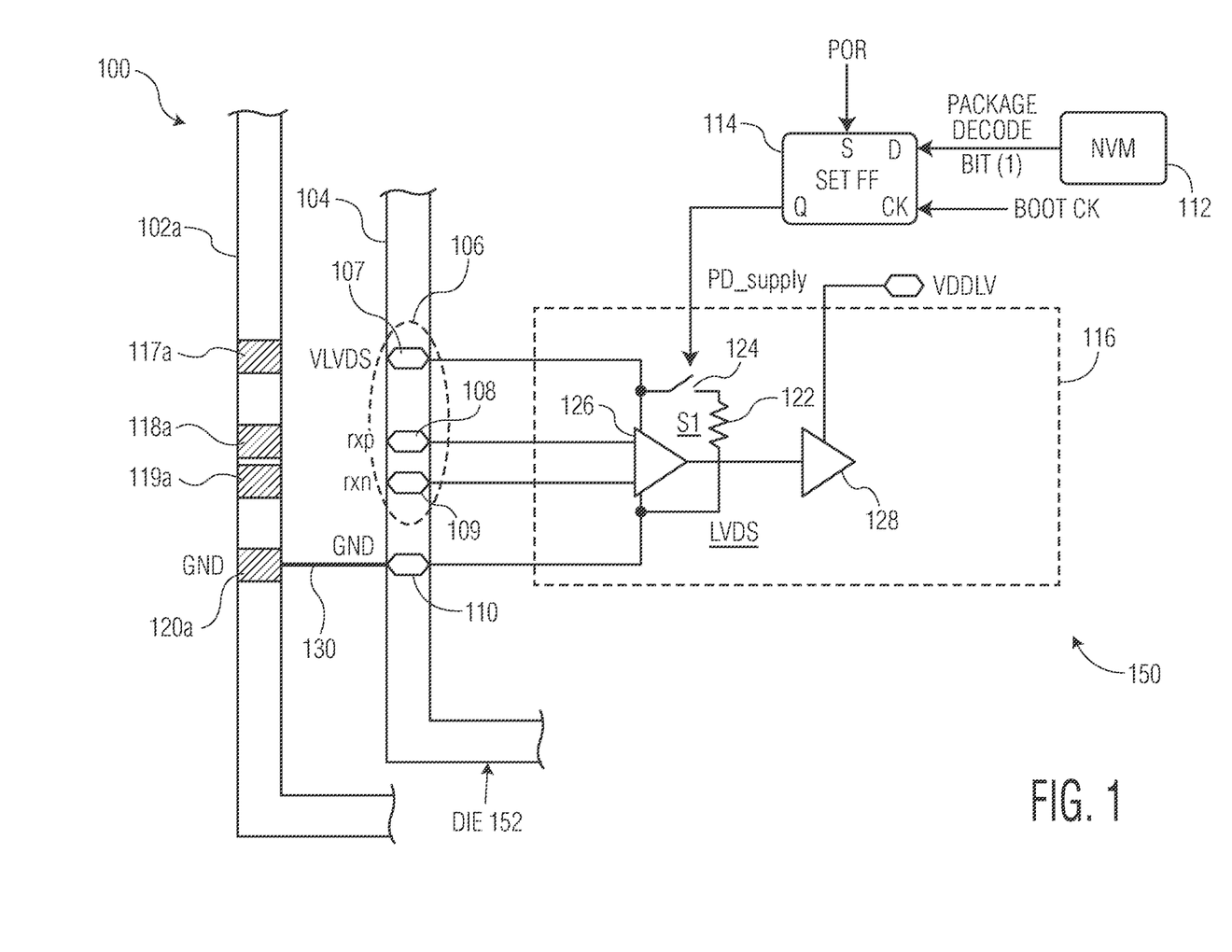
FIG. 1 illustrates a power supply handling circuit within a packaged die, in a first package configuration, in accordance with an embodiment of the present invention.

FIG. 1 illustrates a packaged die 100 (also referred to as package 100), which includes a package with a die 152 having bond pads 107-110 in a portion of a pad ring 104 of die 152, in which the package is configured in accordance with a first configuration. The bond pads of die 152 corresponds to external bond pads (i.e. external contacts) of die 152 which can be bonded out to package pins, as known in the art. They may also be referred to as internal pins or die pins of die 152. Packaged die 100 includes external pins 117a-120a, in which, in the first configuration, bond pads 106 correspond to unbonded pads, which are not bonded out to any pins of the package, and bond bad 110 is bonded to pin 120a via electrical connection 130. In this embodiment, pins 117a-119a can multiplexed and thus used as other types of pins, such as GPIO pins bonded to corresponding GPIO pads (not shown) of die 152.

Die 152 includes an LVDS circuit 116 which is coupled to power supply pads 107 and 110, and signal pads 108 and 109. LVDS circuit 116 includes a receiver portion 126 coupled between power supply pad 107 (i.e. a first power supply terminal) coupled to receive a first power supply, e.g. VLVDS, and power supply pad 110 (i.e. a second power supply terminal) coupled to receive a second power supply, e.g. ground (GND), which is less than the first power supply. For ease of description, each of the first and second power supply terminals (i.e. pads 107 and 110) may simply be referred to as VLVDS and GND, respectively. LVDS circuit 116 also includes Complementary Metal-Oxide Semiconductor (CMOS) circuitry 128 driven by the output of receiver 126 and powered by VDDLV provided at a corresponding power supply terminal. Note that any known LVDS circuit 116 can be implemented as known in the art. In the first package configuration, though, LVDS circuit 116 may not be used, in which VLVDS is not needed. In this example, as illustrated in FIG. 1, none of pads 106 (including the VLVDS power supply pad and rxp/rxn signal pads) are bonded to pins of package 100. Note that in alternate embodiments, LVDS circuit 116 can represent any circuitry coupled to pads of die 152 for communicating signals and power supplies, in which some of these pads may be left unbonded depending on the application of package die 100. LVDS circuit 116 is simply provided as an example.

Die 152 includes a power supply handling circuit 150 which includes an NVM 112 (which can be implemented with any non-volatile type of storage circuitry, such as, for example, fuses) configured to store a package decode bit, a SET flip flop (FF) 114, a switch S1 124 (which may simply be referred to as S1 or switch S1), and a pull-down resistive element 122. SET FF 114 includes a data input (D) coupled to receive the package decode bit from NVM 112, a clock input (CK) coupled to receive a boot clock (boot CK), a data output (Q) coupled to provide an output bit, and a set input (S) coupled to receive a power on reset (POR) signal. Note that the POR signal can be generated within die 152 as known in the art. Upon a reset of die 152, POR as asserted to a logic level one, and subsequently released (negated back to a logic level 0) during the reset process. When the reset is complete (such that the boot clock is up and running and NVM 112 can be read), FF 114, in response to an active edge (e.g. rising edge) of the boot CK, propagates the bit value at input D to output Q. The S input is an asynchronous input such that, as soon as POR is asserted to a logic level one (i.e. passes the trigger voltage of the S input), Q is set to a logic level one, regardless of any signal at the CK input of FF 114 (and regardless of the value of D). Therefore, note that the D input can be referred to as a synchronous input (synchronous to the CK input), as compared to the asynchronous S input. Although FF 114 is illustrated as a positive edge D-type FF (in which the active edge is the rising edge such that the FF is triggered by rising edges of the CK input), alternate embodiments may use a negative edge D-type FF (in which the active edge is the falling edge such that FF is triggered by the falling edges of the CK input), or other types of FFs or combinations of logic which provide the desired functionality.

Switch S1 includes a first signal terminal connected to pad 106, a second signal terminal connected to a first terminal of resistive element 122, and a control terminal of switch S1 is coupled to the Q output of FF 114. A second terminal of resistive element 122 is connected to pad 110, which is bonded to GND pin 120 of package 100. (Resistive element 122 can also be referred to as a resistor and can be implemented using one or more resistors.) Therefore, when Q is asserted to a logic level one, S1 is closed (i.e. turned on or placed in a conductive state) such that resistive element 122 is enabled, i.e. connected between pad 106 and pad 110 to provide a pull-down path for VLVDS. When Q is negated to a logic level zero, S1 is open (i.e. turned off or placed in a non-conductive state) such that pull-down resistive element 122 is not enabled. Therefore, the pull-down path provided by S1 and resistive element 122 is a selectively enablable pull-down path (also referred to as a switchable pull-down path which can be enabled or disabled based on whether S1 is in the conductive state or non-conductive state, respectively). In the illustrated embodiment of FIG. 1, when S1 is open, VLVDS is left floating, which can be problematic or damaging for LVDS circuit 116. Therefore, by storing a one as the package decode bit in NVM 112, indicating that VLVDS is not implemented in the package configuration and is thus unbonded, switch S1 is closed so as to enable the pull-down resistive element 122 to safely pull-down the unused VLVDS to ground, as opposed to leaving it floating.

Figure 2:
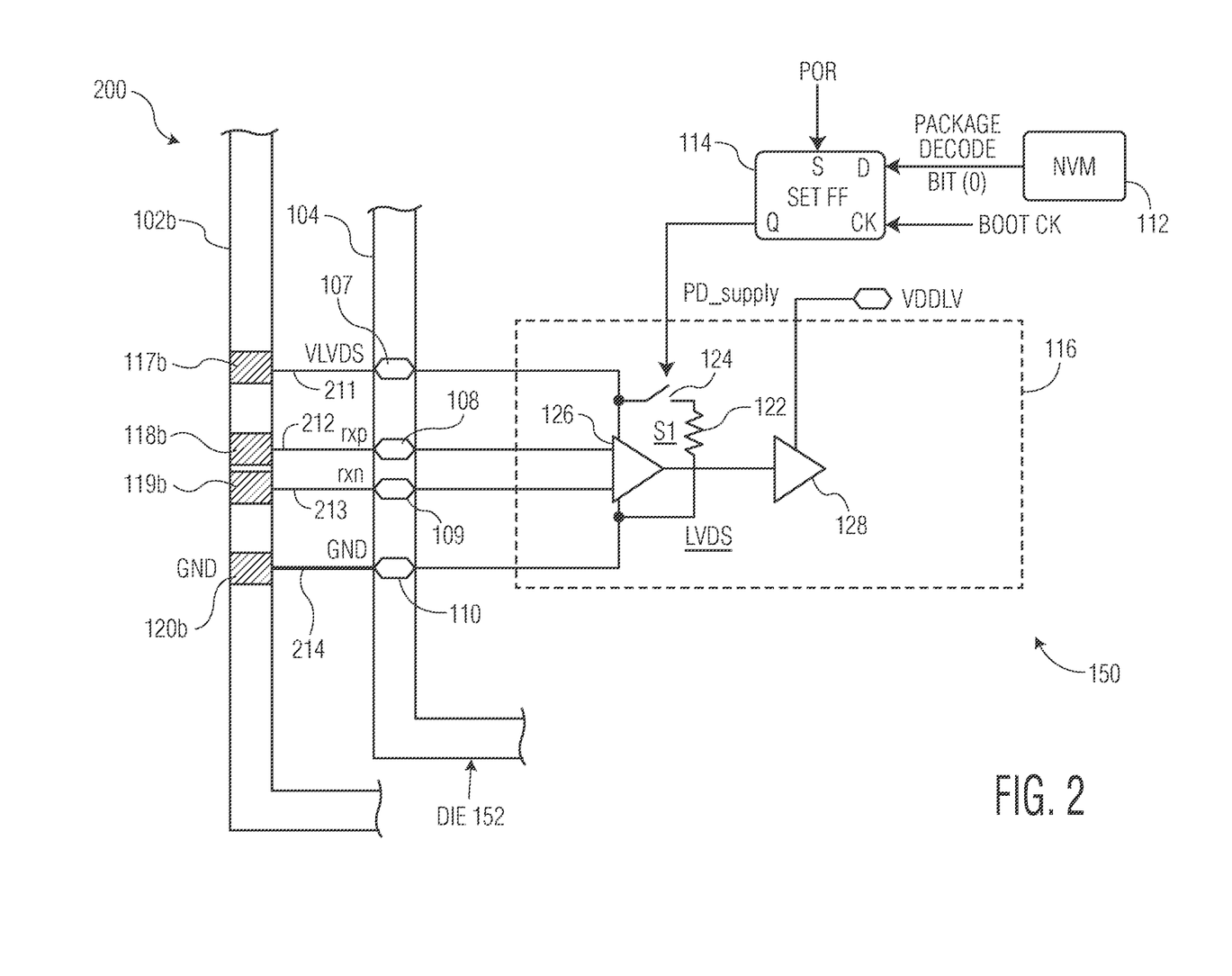
FIG. 2 illustrates a power supply handling circuit within a packaged die, implemented in a second package configuration, in accordance with an embodiment of the present invention.

FIG. 2 illustrates a packaged die 200 (also referred to as package 200), which includes die 152, but in which package 200 is configured in accordance with a second configuration. In the configuration of FIG. 2, all of bond pads 107-110 are bonded to corresponding pins 117b-120b of package 200, via electrical connects 211-214, respectively. In this example, there are no unbonded pads (and thus no floating supply voltages) for LVDS circuit 116. That is, in the embodiment of FIG. 2, LVDS circuit 116 is needed and thus the configuration of package 200 allows access, via pins 117b-120b to all pads 107-110 used by LVDS circuit 116. In this embodiment, a zero can be stored as the package decode bit in NVM 112, indicating no unbonded power supplies for LVDS circuit 116, such that switch S1 is opened to disable pull-down resistive element 122.

Therefore, in the illustrated embodiments of FIGS. 1 and 2, the package decode bit is set to one to indicate the first configuration and zero to indicate the second configuration. In alternate embodiments, there may be more than two possible configurations, and the package decode bit can instead be implemented as a multi-bit value to identify a particular package configuration. Furthermore, die 152 can include additional selectively enablable pull-down paths, each with a corresponding switch and resistive element, for other power supply pads coupled to supply power to other circuitry of die 152 which may be floating in one configuration (e.g. first configuration) but not in another configuration (e.g. second configuration).

Regardless of the stored state of the package decode bit (or bits), NVM 112 cannot properly be read immediately upon reset. For example, upon reset, the device begins a reset sequence including various phases. During reset, the POR is asserted to a logic level one and, at some point during reset, the boot CK becomes operational. Therefore, in one embodiment, power supply handling circuit 150 receives the POR signal asynchronously so as to close S1 until the package decode bit can be properly sampled (i.e. read) from NVM 112. Operation of this aspect will be described in reference to the timing diagrams of FIGS. 3 and 4.

Figure 3:
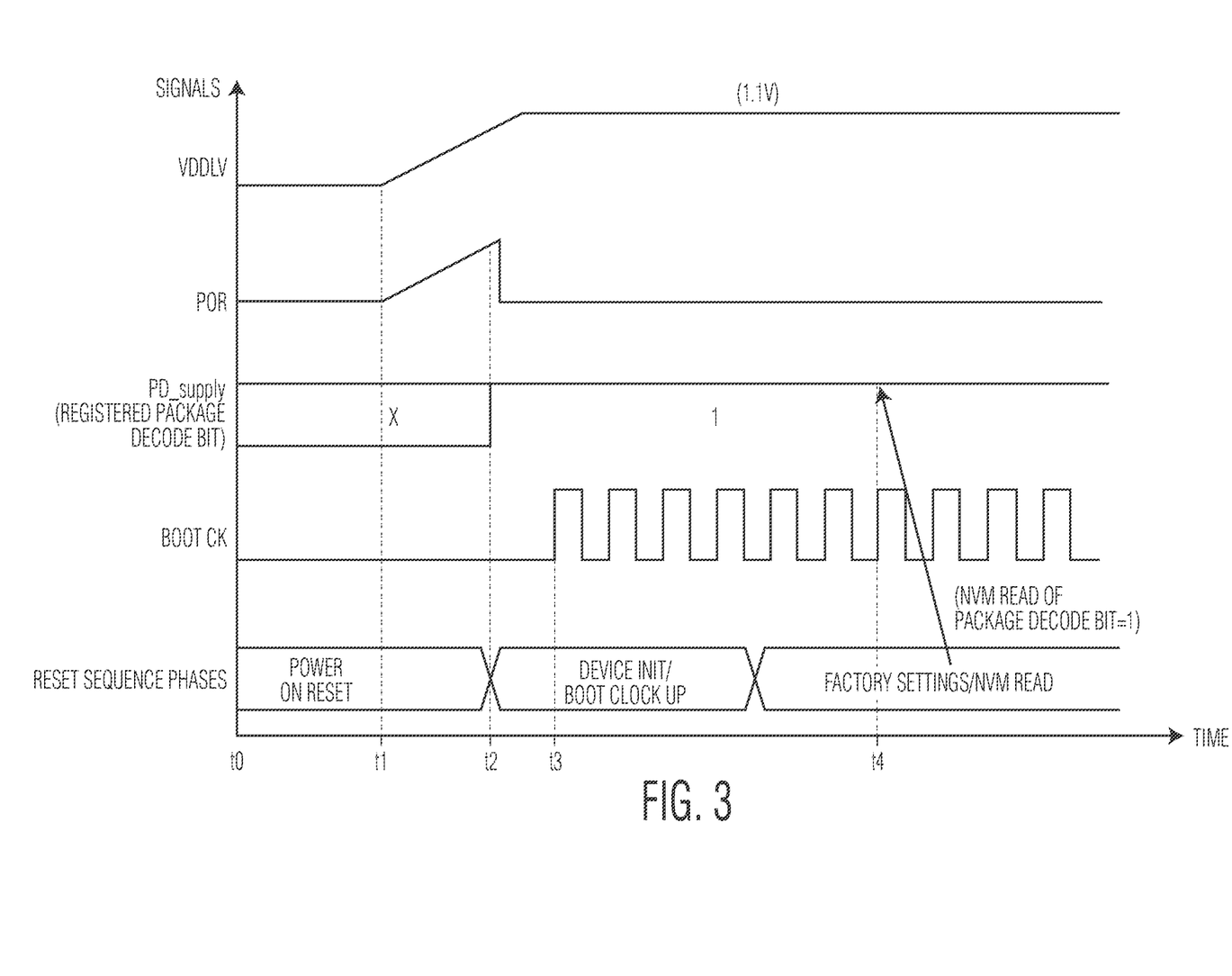
FIG. 3 illustrates a timing diagram of various signals in the power supply handling circuit of FIG. 1, in accordance with an embodiment of the present invention.

FIG. 3 illustrates a timing diagram of various signals of die 152 according to the example package configuration of FIG. 1, in which a logic level one is stored in NVM 112 (indicating an unbonded power supply pad). The timing diagram begins with time t0 in which a power-on-reset is performed and the reset sequence phases begin. In response thereto, VDDLV (the power supply supplied by the power supply terminal coupled to CMOS logic 128, which can also power FF 114 and NVM 112) starts coming up at time t1. The POR signal is asserted and also starts to increase At this point, PD_supply (provided by the Q output of FF 114) is still indeterminate because the package decode bit still cannot be read and the POR signal has not yet triggered the S input. At time t2, though, the POR signal triggers the asynchronous S input of FF 114, causing PD_SUPPLY to go to a logic level one (regardless of any signal at the CK input and regardless of any value of the package decode bit in NVM 112). Therefore, at time t2, S1 is closed, enabling the pull-down path from VLVDS to GND via resistive element 122. This protects LVDS circuit 116 while VLVDS is floating but the state of the package decode bit in NVM 112 is still unknown.

The reset process continues as the device initializes and by time t3, POR is negated, VDDLV is fully powered (at, e.g., 1.1V), and the boot CK is up and running. The factory settings can then be set and NVM 112 can be read. For example, at time t4, the reset process is completed such that the package decode bit in NVM 112 can be read and captured by FF 114 in response to a rising edge of the boot CK. Therefore, at time t4, the value of one for the package decode bit read from NVM 112 is provided by FF 114 as PD_supply which maintains S1 in the closed position. This prevents VLVDS from floating during operation of die 152.

Figure 4:
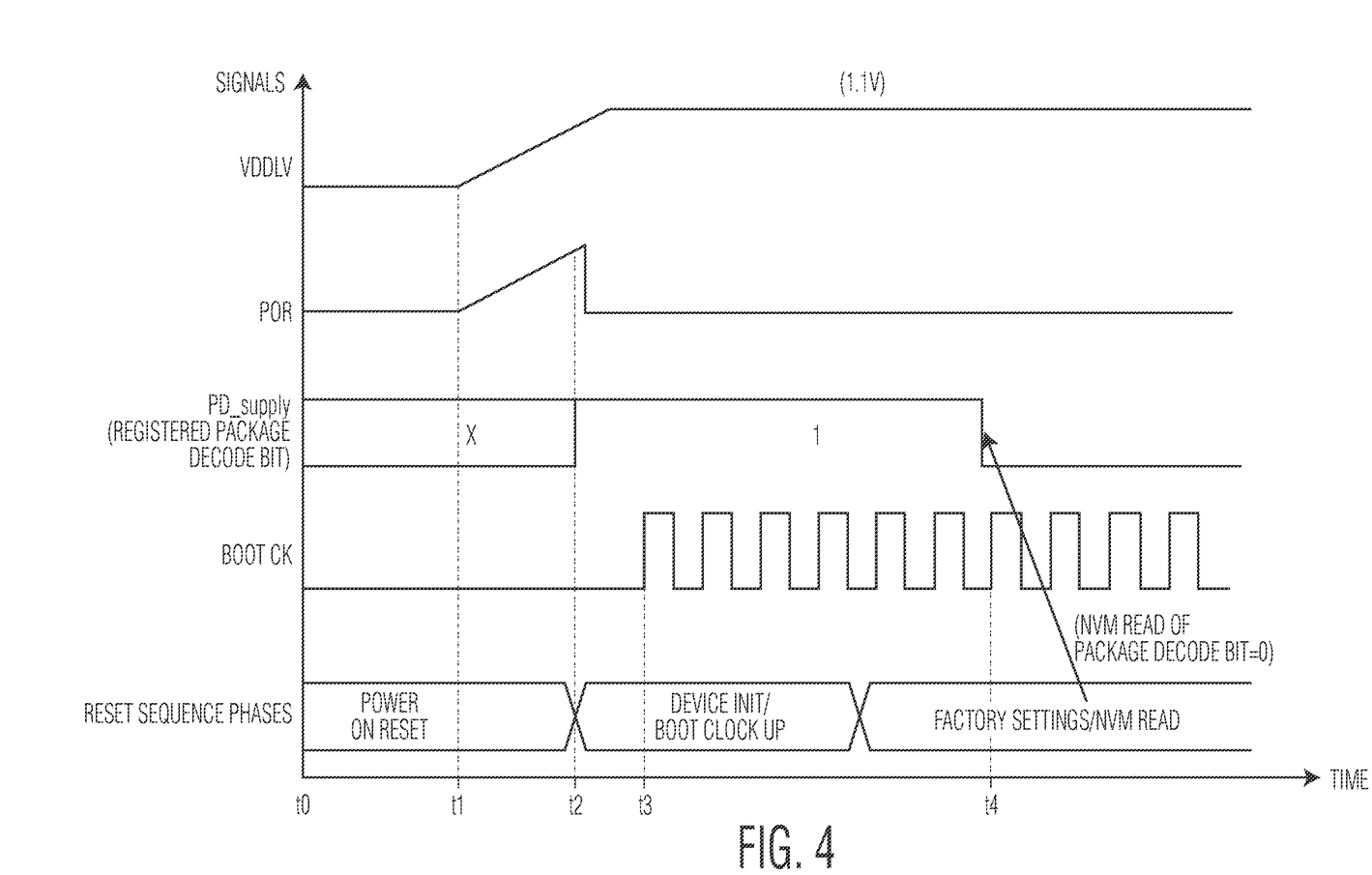
FIG. 4 illustrates a timing diagram of various signals in the power supply handling circuit of FIG. 2, in accordance with an embodiment of the present invention.

FIG. 4 illustrates a timing diagram of the same signals as in FIG. 3, but according to the example package configuration of FIG. 2, in which a logic level zero is stored in NVM 112 (indicating no unbonded power supply pads for LVDS circuit 116). The timing diagrams of FIGS. 3 and 4, up until t4, operate the same way. That is, assertion of the POR closes switch S1 to prevent VLVDS from floating until reset completes and the value of the package decode bit can be read and captured by FF 114. In this example, at time t4, the value of zero for the package decode bit read from NVM 112 is provided by FF 114 as PD_supply which opens S1. Therefore, S1 is temporarily closed upon reset (t2 to t4) to provide the pull-down path through resistive element 122 until the package decode bit can be properly read. In this case, even though S1 did not need to be closed because VLVDS is not floating in this package configuration, LVDS circuit 116 is protected until the package configuration is "known" by power supply handling circuit 150, in case the configuration is instead that of FIG. 1 in which pad 107 is left floating.

Figure 5:
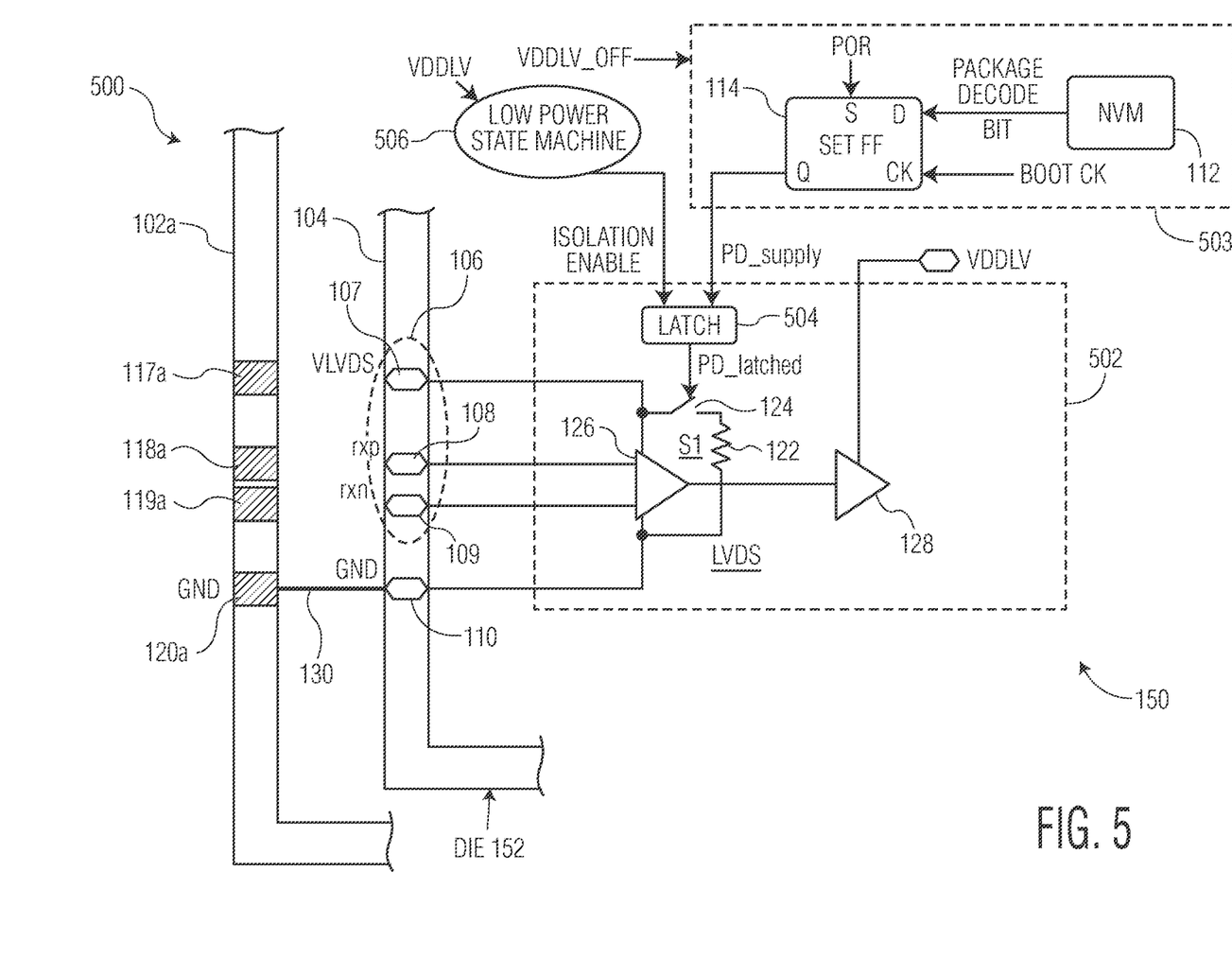
FIG. 5 illustrates a power supply handling circuit, including lower power mode (LPM) protection, as implemented in the first package configuration, in accordance with an embodiment of the present invention.

FIG. 5 illustrates a packaged die 500 (also referred to as package 500), which includes a package with a die 152, in which package 500 is configured in accordance with the first configuration, as illustrated and described in reference to FIG. 1, but with additional circuitry in power supply handling circuit 150 to enable safe operation in a low power mode (LPM), including entry to LPM and exit from LPM. (Note that the same additional circuitry is used in the embodiments in which package 500 is configured with the second configuration as well.) In die 152, FF 114 and NVM 112 are located in a switchable power domain 508 (also referred to as a switchable voltage domain) which is powered by VDDLV_OFF (in which VDDLV_OFF is a switchable voltage that can be switched on or off). Upon die 152 entering the LPM, VDDLV_OFF is powered down (i.e. is switched off), while VDDLV remains powered up. Therefore, circuitry powered by VDDLV may be referred to as being located in an always-on power domain. In the illustrated embodiment of FIG. 5, an LVDS circuit 502, which is similar to LVDS circuit 116 but with an additional latch 504, is located as part of the always-on power domain.

A low power state machine (LPSM) 506, which controls entry into and exit from LPM is also located in the always-on power domain, and provides an isolation enable control signal to latch 504. LPSM 506 can be implemented as known in the art. Latch 504 receives PD_supply from the Q output of FF 114 at a data input and receives the isolation enable signal from LPSM 506 at a control input, and provides PD_latched at its output to control switch S1. When the isolation enable signal is asserted to a logic level one, latch 504 is isolated from PD_supply so that changes in the value of PD_supply does not change the latched value in latch 504. That is, with the isolation enable signal asserted, the value in latch 504, and thus PD_latched, is maintained in a persistent state (corresponding to the previously read value of the package decode bit). When the isolation enable signal is negated to a logic level zero so as to disable isolation, latch 504 provides the latched value of PD_supply as PD_latched. During LPM, since VDDLV_OFF is off, FF 114 cannot properly read the package decode bit from NVM 112. Therefore, the isolation enable signal can be set so as to ignore any value of PD_supply during LPM (or the transitions to and from LPM) to ensure S1 maintains the state set by the correct value of the package decode bit, as will be described in reference to the timing diagrams of FIGS. 6-9.

Figure 6:
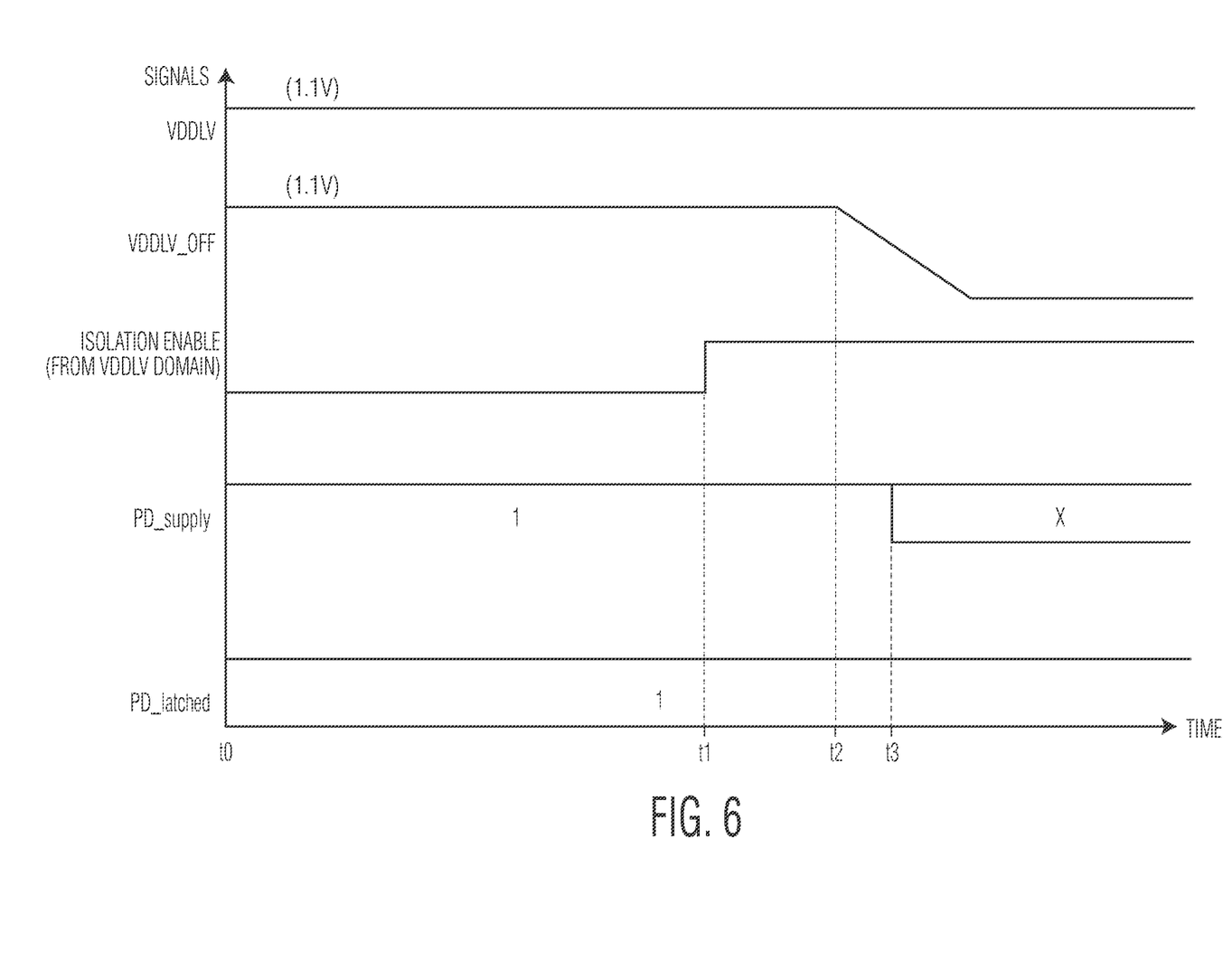
FIGS. 6 and 8 illustrate timing diagrams of various signals in the power supply handling circuit of FIG. 5, in accordance with embodiments of the present invention.

FIG. 6 illustrates a timing diagram of various signals of die 152 for entry into LPM according to the embodiment of FIG. 5, in which package 500 is configured in accordance with the first configuration. In this first configuration, a logic level one is stored in NVM 112 as the package decode bit, indicating an unbonded power supply pad. At time t0 of FIG. 6, die 152 is operating in normal mode (i.e. a non-low power mode), in which both VDDLV and VDDLV_OFF are powered up (at, e.g., 1.1V). In one embodiment, during normal mode, VDDLV_OFF is set to the same voltage level as VDDLV. In normal mode, FF 114 and NVM 11 are still powered, thus the Q output of FF 114 provides a logic level one to latch 504. With isolation enable negated to a logic level zero, latch 504 provides the value of one for PD_supply as PD_latched. Therefore, during normal mode, switch S1 is closed by the value of PD_latched. After time to, a request to enter LPM mode is received by LPSM 506 which controls entry into LPM.

At time t1, LPSM 506 asserts the isolation enable signal such that the output of latch 504, PD_latched, remains asserted to a one, regardless of the value of PD_supply. Therefore, upon assertion of the isolation enable signal, S1 is maintained closed. At time t2, VDDLV_OFF is turned off for LPM and therefore starts to decrease. At time t3, NVM 112 and FF 114 are lost (i.e., they are no longer sufficiently powered to operate), thus PD_supply enters an indeterminate (unknown) state. However, with the isolation enable signal asserted while operating in LPM, latch 504 continues to store the logic level one, allowing S1 to remain closed to prevent the floating of VLVDS during operation in LPM.

Figure 7:
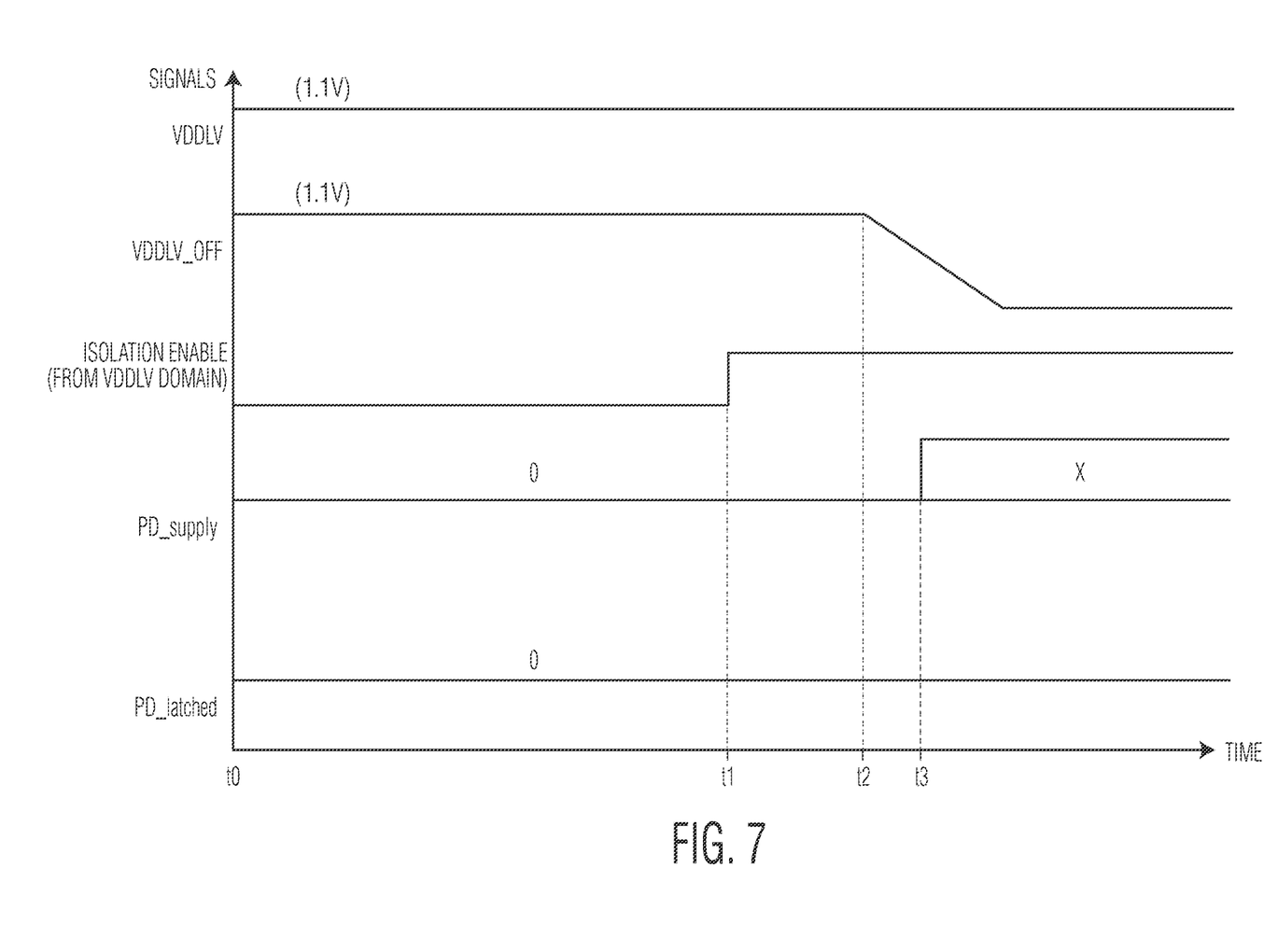
FIGS. 7 and 9 illustrate timing diagrams of various signals in the power supply handling circuit of FIG. 5, assuming it were implemented in the second package configuration, in accordance with embodiments of the present invention.

FIG. 7 illustrates a timing diagram of the same signals as in FIG. 5 for entry into LPM, but in this embodiment, it is assumed that package 500 is instead configured in accordance with the second configuration (with bond pads 107-110 bonded as illustrated in FIG. 2), in which a logic level zero is stored in NVM 112 as the package decode bit. In this case, while operating in normal mode, prior to entry into LPM, PD_supply is provided as zero at the output Q of FF 114. With the isolation enable signal negated during normal mode, latch 504 provides the value of zero for PD_supply as PD_latched, resulting in switch S1 being open. At time t1, LPSM 506 asserts the isolation enable signal such that the output of latch 504, PD_latched, remains a zero, and thus S1 is maintained open. At time t2, VDDLV_OFF is turned off, and, at time t3, PD_supply enters an indeterminate state, as described in reference to the example of FIG. 6. However, even though PD_supply is no longer reliable or valid, with the isolation enable signal asserted, latch 504 continues to provide a logic level zero which allows S1 to remain open.

Figure 8:
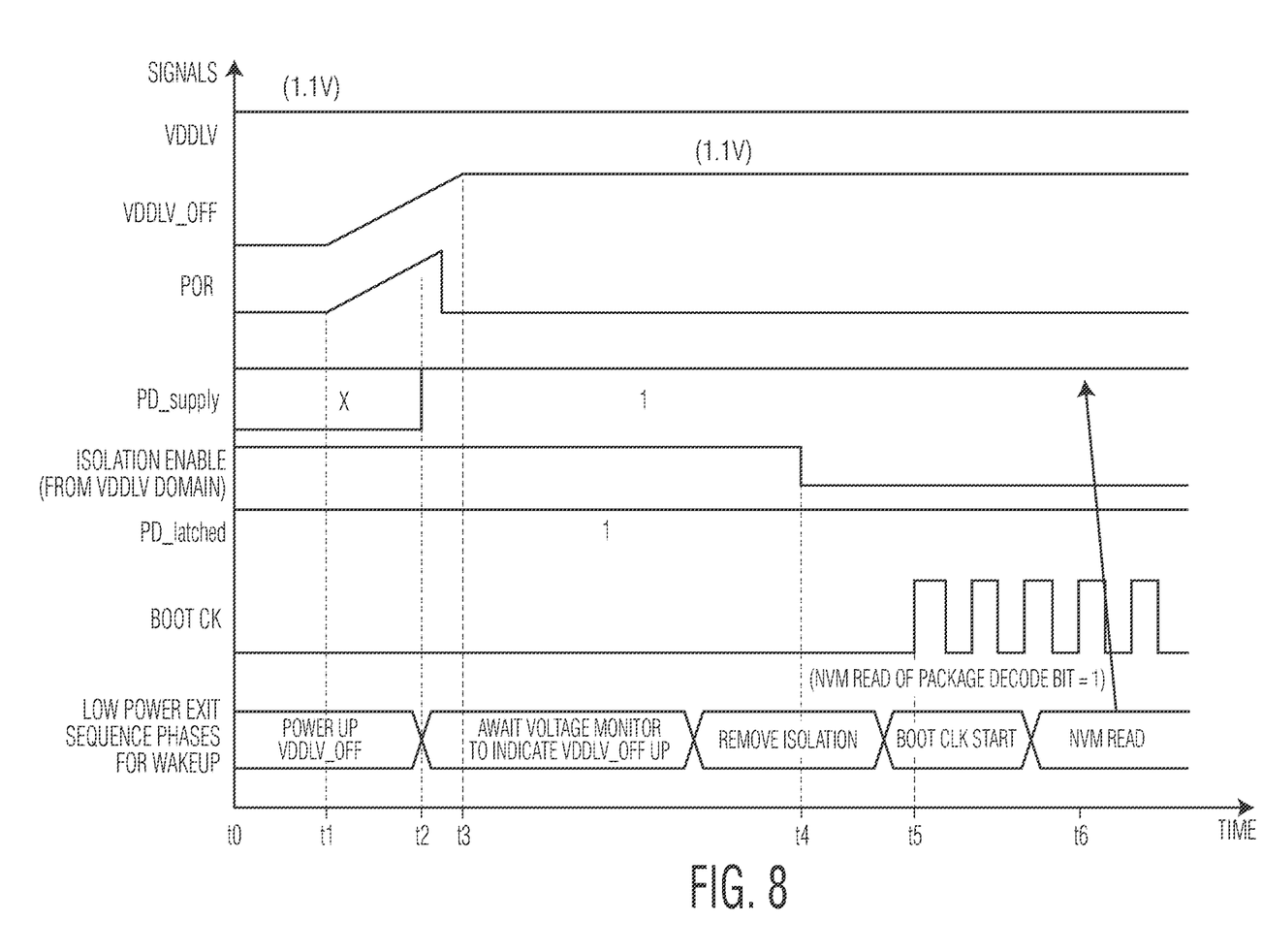

FIG. 8 illustrates a timing diagram of various signals of die 152 for exiting from LPM according to the embodiment of FIG. 5, in which package 500 is configured in accordance with the first configuration. The timing diagram of FIG. 8 can follow, for example, the timing diagram of FIG. 6, since FIG. 6 illustrates entry into LPM when package 500 is configured in accordance with the first configuration. At time t0, die 152 is still operating in LPM, in which VDDLV is powered up (at, e.g., 1.1V), but VDDLV_OFF is off, and LPMS 506 receives a wakeup request. At time t0, POR is negated to a zero, PD_supply is indeterminate (since VDDLV_OFF is powered down), the isolation enable is still asserted to a logic level one, and PD_latched is provided as a logic level one (since package 500 is configured in accordance with the first configuration). At time t0, in response to the wakeup request, the LPMS 506 begins to execute the sequence phases for waking up die 152. At time t1, VDDLV_OFF begins to power up and POR is asserted, and at time t2, the POR triggers the S input of FF 114, as described above in reference to FIGS. 1 and 3, and PD_supply is set to a logic level one by FF 114. Note that the isolation enable signal remains asserted by LPSM 506, such that latch 504 continues to provide PD_latched as a logic one (indicating the first package configuration), regardless of the value of PD_supply. At time t3, VDDLV_OFF is powered up. (In the current wakeup sequence phase, a voltage monitor in die 152 can monitor VDDLV_OFF, as known in the art, and indicates when VDDLV_OFF is fully powered up and reliable.)

In a subsequent wakeup sequence phase, isolation is removed, in which, at time t4, the isolation enable signal is negated to zero. At this point, latch 504 is no longer isolated and therefore provides the value of PD_supply as PD_latched. In this example, PD_latched remains a logic level one. After isolation is removed, the boot CK is started at time t5 (which is received by the CK input of FF 114, allowing FF 114 to sample data at its D input). Finally, upon completion of the wakeup process, the package decode bit in NVM 112 is read at time t6 by FF 114 to set PD_supply accordingly to control S1. In this example, PD_latched remains at one since the packaged decode bit in NVM 112 is stored as one.

Figure 9:
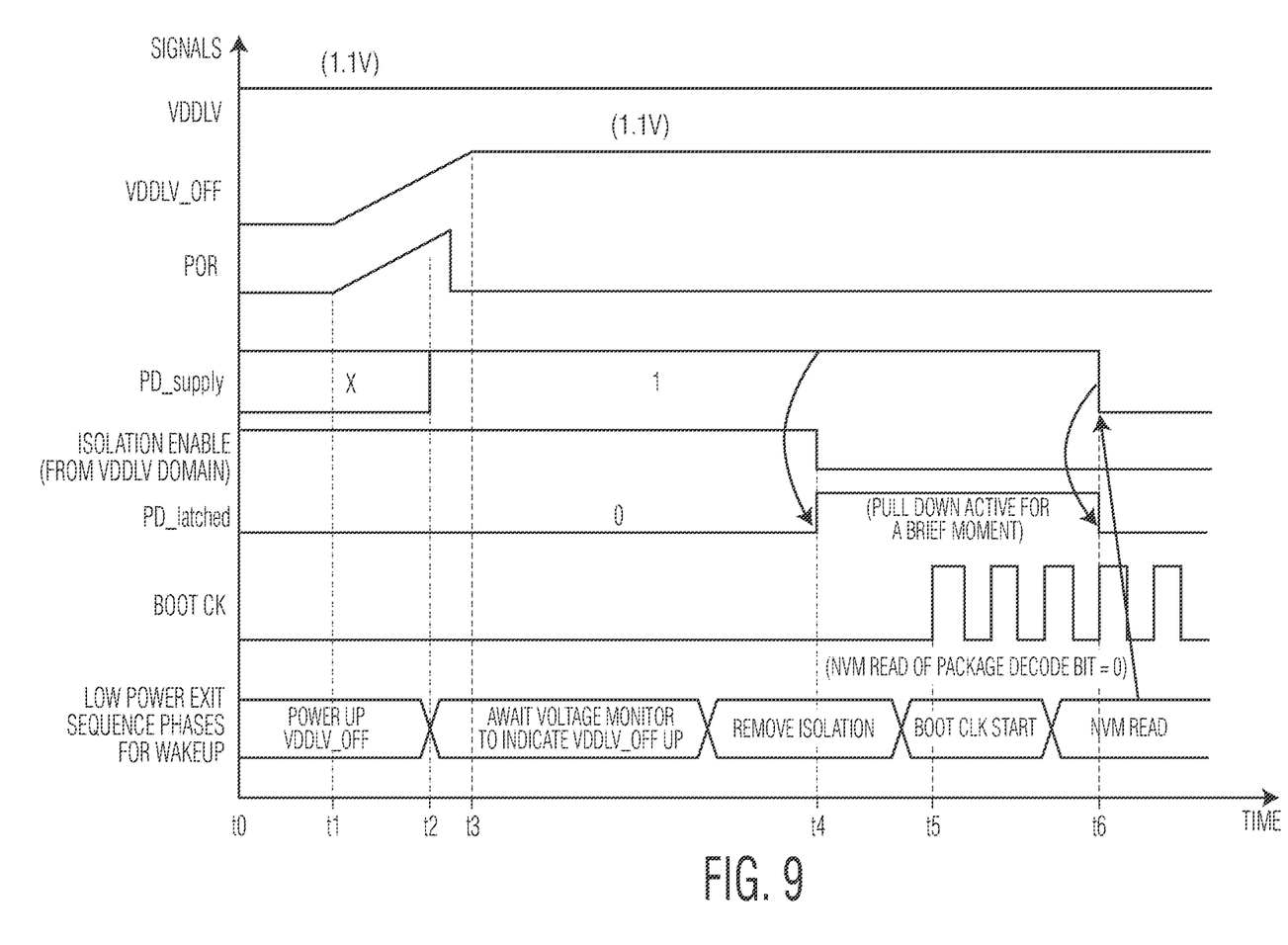

FIG. 9 illustrates a timing diagram of the same signals as in FIG. 8 for exiting from LPM, but in this embodiment, it is assumed that package 500 is instead configured in accordance with the second configuration, in which a logic level zero is stored in NVM 112 as the package decode bit. Operation for times t0-t3 are the same as was described with respect to FIG. 8, except that since the package decode bit is a zero to identify the second package configuration, latch 504 maintains PD_latched as zero while the isolation enable signal is asserted. At time t4, when the isolation enable signal is negated to remove isolation, latch 504 provides the value of PD_supply as PD_latched. In this embodiment, since PD_supply is set to one (at time t2) by the POR signal on the S input of FF 114, PD_latched is also provided as a one. This results in closing switch S1 until the package decode bit can again be properly read by FF 114. The boot CK starts at time t5, and at time t6, the package decode bit in NVM 112 is again read by FF 114, resulting in setting PD_supply to zero and thus PD_latched to zero as well. This again opens S1.

Therefore, note that regardless of the package configuration (i.e. whether the package decode bit is stored as a one or a zero), the power supply pad handling circuit 150 ensures that S1 is properly controlled, providing a pull-down path as needed for any power supply which would otherwise be floating in accordance with the selected package configuration. In some instances, as seen in the examples of FIGS. 4 and 9, some of the protections included in power supply handling circuit 150 result in S1 being temporarily closed (temporarily enabling a pull-down path for a power supply pad) which is not a floating power supply pad. In these designs, it may be better to err on providing the pull-down path for a power supply pad that is not actually floating for a short period of time rather than risking not pulling down a power supply pad which is floating during that period of time. During the short period of time (e.g. t2-t4 in FIG. 4 or t4-t6 in FIG. 9), only a small amount of power is lost through resistive element 122 since resistive element 122 need not be very large to provide the pull-down path. However, this may be preferable to temporarily allowing S1 to remain open when the power supply pad connected to S1 is floating, risking damage to die 152.

Note that the protections described herein with respect to the POR provided to the asynchronous input of FF 114 and with respect to selectively isolating latch 504 can be implemented together to provide improved protection across different package configurations. That is, as described in reference to each of FIGS. 8 and 9, the provision of POR to the S input of FF 114 configures S1 as closed during power up until the package decode bit can be read, regardless of the presence of LPSM 506 and latch 504. That is, FF 114 and NVM 112 operate as described above in reference to FIGS. 1 and 2, even with the addition of latch 504 (with the exception that without latch 504, PD_supply can be directly provided to S1 to control the conductive state of S1). Note also that in alternate embodiments, latch 504 can be located at different location to provide protection for LPM. For example, it can be placed between NVM 112 and FF 114 (assuming FF 114, like latch 504, is also in the always-on domain powered by VDDLV), such that, when the isolation enable signal is asserted, latch 504 can provide the previously stored value of the package decode bit to the D input of FF 114. In this manner, PD_supply at the Q output of FF 114 would provide the proper persistently stored state in latch 504 while the isolation enable signal is asserted and provide the value of the package decode bit read from NVM 112 otherwise. The POR provided to the S input would continue to operate in the same manner as described above.

Figure 10:
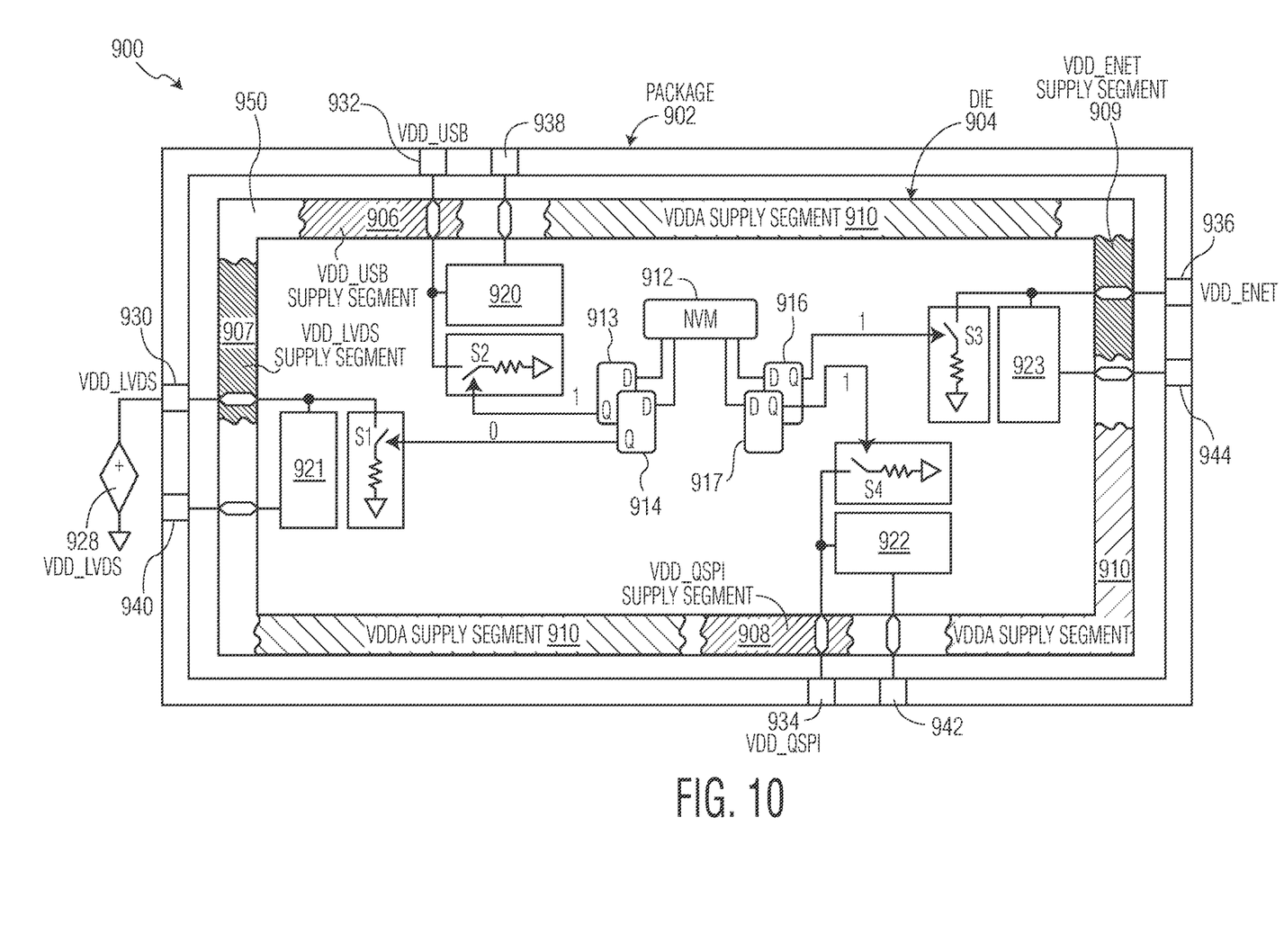
FIG. 10 illustrates a packaged semiconductor die having a power supply handling circuit which controls multiple power supply pads, in accordance with an embodiment of the present invention.

FIG. 10 illustrates, in block diagram form, a packaged die 902 (also referred to as package 902) including a die 904, in accordance with one embodiment of the present invention. Die 904 includes various I/O interface segments (including segments 906-909) in the pad ring of die 904, each corresponding to a power supply pad coupled to receive a corresponding power supply. Each segment can be a single continuous segment or can be distributed within the pad ring of die 904. Each segment may correspond, for example, to a particular type of interface, such as segment 906 for a Universal Serial Bus (USB) interface, segment 907 for an LVDS interface (similar to the interfaces provided as examples in FIGS. 1, 2, and 5), segment 908 for a queued serial peripheral interface (QSPI), and segment 909 for an ethernet (ENET) interface. A segment 910 corresponds to a particular voltage domain which provides a power supply voltage, VDDA, to circuitry within die 910.

Interface segment 906 corresponds to a VDD USB supply pad bonded to package pin 932 to receive a VDD USB power supply. Circuitry 920 within die 904 is powered by VSS USB. Interface segment 907 corresponds to a VDD LVDS supply pad bonded to package pin 930 to receive a VDD LVDS power supply. Circuitry 921 within die 904 is powered by VDD LVDS. Interface segment 908 corresponds to a VDD QSPI supply pad bonded to package pin 934 to receive a VDD QSPI power supply. Circuitry 922 within die 904 is powered by VDD QSPI. Interface segment 909 corresponds to a VDD_ENET supply pad bonded to package pin 936 to receive a VDD_ENET power supply. Circuitry 923 within die 904 is powered by VDD_ENET. Each of circuitry 920-923 is also coupled to a corresponding ground node or ground pad, in which one or more of the ground pads are connected to corresponding ground pins 932, 940, 942, and 944, respectively, of package 902. Bonded pads are illustrated with a line drawn between the pad of die 904 and a corresponding pin of package 902.

Die 904 includes a switch and pull-down resistor (referred to as a selectively enablable internal pull-down path) corresponding to each power supply pad in segments 906-909. For example, switch S1 is coupled between the VDD LVDS pad and a first terminal of a corresponding pull-down resistor. Similarly, switch S2 is coupled between the VDD USB pad and a first terminal of a corresponding pull-down resistor, switch S3 is coupled between the VDD_ENET pad and a first terminal of a corresponding resistor, and switch S4 is coupled between the VDD QSPI pad and a first terminal of a corresponding pull-down resistor. A second terminal of each of the corresponding pull-down resistors is coupled to ground. Therefore, each of switches S1-S4 can be selectively enabled to provide a pull-down path from the corresponding power supply pad to ground (similar to how switch S1 is controlled in the embodiments of FIGS. 1, 2, and 5 above to provide a pull-down path to ground through resistive element 122).

Die 904 includes NVM 912 (which can be any type of non-volatile storage, such as fuses). In one embodiment, an interface decode bit, similar to the package decode bit, for each interface segment is stored in NVM 912. Each interface decode bit controls the switch (and thus the enabling/disabling of the internal pull-down path) for the corresponding interface segment, and does so by way of a corresponding flip flop (FF). Therefore, NVM 912 provides a corresponding interface decode bit to each of FFs 913, 914, 916, and 917 to control switches S2, S1, S3, and S4, respectively. These FFs operate analogously to FF 114 and switches S1-S4, along with the corresponding resistive element, operate analogously to S1 124 and resistive element 122. In the illustrated embodiment of FIG. 10, NVM 912 stores a one for the interface decode bit for each of S2, S3, and S4, and a zero for S1. Therefore, each of S2, S3, and S4 are closed so as to enable the corresponding pull-down path through the corresponding resistive element to ground. That is, with each of S2, S3, and S4 in the conductive state, the corresponding power supply pad is electrically connected to ground via the corresponding resistive element. In this manner, for each of the corresponding pins for switches S2-S4 (e.g. pins 938, 944, and 934, respectively), an external pull-down resistor (external to package 902) is not needed to provide pull-down capability for the pins, as would be required in the absence of the selectively enabled internal pull-down paths. Since NVM 912 stores a zero to control switch S1, though, the internal pull-down path is disabled, and an external voltage supply 928 can be supplied external to package 902. The use of the internal pull-down paths may help improve costs by customers using packaged device 902, by removing the cost of external pull-down resistors.

Note that NVM 912 can also store package decode bits, as needed, for any circuitry which supports multiple package configurations, as was described above with respect to the first and second package configurations for LVDS circuit 116. That is, a packaged die can include both package decode bits, as needed, and interface decode bits, as needed. Note that some or all of the protections described above for the power supply pad handling circuits using the package decode bits, such as the asynchronous input to receive the POR signal or the additional latch to store a persistent state (e.g. latch 504) can also be used with NVM 912, FFs 913, 914, 916, and 917, and the corresponding selectively enablable pull-down paths, as needed. Also, note that each of the package decode bits or the interface decode bits can generally be referred to as pull-down path enable bits, since each of these enable bits enable or disable a corresponding pull-down path by closing or opening the corresponding switch of the pull-down path.

Therefore, by now it can be appreciated how a power supply handling circuit can selectively enable pull-down paths for a corresponding power supply pad, based on a particular package configuration, in order to prevent that power supply pad from floating. The power supply handling circuits therefore prevent damage to circuitry of the die coupled to the power supply pads which could occur if the corresponding power supply pad were allowed to remain floating. The power supply handling circuits may also include additional protections to prevent floating power supply pads during reset or during LPM operation. Further, circuits similar to the power supply handling circuit can also be used to selectively provide internal pull-down paths within a die for power supply pads of different interface segments of the pad ring of the die.

The terms "assert" or "set" and "negate" (or "deassert" or "clear") are used herein when referring to the rendering of a signal, status bit, or similar apparatus into its logically true or logically false state, respectively. If the logically true state is a logic level one, the logically false state is a logic level zero. And if the logically true state is a logic level zero, the logically false state is a logic level one. Each signal described herein may be designed as positive or negative logic, where negative logic can be indicated by a bar over the signal name or an asterisk (*) following the name. In the case of a negative logic signal, the signal is active low where the logically true state corresponds to a logic level zero. In the case of a positive logic signal, the signal is active high where the logically true state corresponds to a logic level one. Note that any of the signals described herein can be designed as either negative or positive logic signals. Therefore, in alternate embodiments, those signals described as positive logic signals may be implemented as negative logic signals, and those signals described as negative logic signals may be implemented as positive logic signals.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Although the invention has been described with respect to specific conductivity types or polarity of potentials, skilled artisans appreciated that conductivity types and polarities of potentials may be reversed.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Some of the above embodiments, as applicable, may be implemented using a variety of different information processing systems. For example, although FIGS. 1, 2, 5, and 10 and the discussion thereof describe an exemplary information processing architecture for the packaged die, this exemplary architecture is presented merely to provide a useful reference in discussing various aspects of the invention. Of course, the description of the architecture has been simplified for purposes of discussion, and it is just one of many different types of appropriate architectures that may be used in accordance with the invention. Those skilled in the art will recognize that the boundaries between logic blocks are merely illustrative and that alternative embodiments may merge logic blocks or circuit elements or impose an alternate decomposition of functionality upon various logic blocks or circuit elements. Further, each of the illustrated die within the packaged die can include additional circuitry, as needed, based on the die design and uses. For example, other circuitry such as processor(s), peripheral(s), other memories, etc., can also be present within the die. Thus, it is to be understood that the architectures depicted herein are merely exemplary, and that in fact many other architectures can be implemented which achieve the same functionality.

Furthermore, those skilled in the art will recognize that boundaries between the functionality of the above described operations merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

Although the invention is described herein with reference to specific embodiments, various modifications and changes can be made without departing from the scope of the present invention as set forth in the claims below. For example, selectively enablable pull-down paths can be placed, as needed, for any power supply pad which can be configured as bonded or floating, based on the package configuration utilized. These power supply pads may be used to supply power to any type of circuitry within the die, and is not limited to LVDS circuitry. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

The following are various embodiments of the present invention.

In one embodiment, a packaged die includes a first power supply pad configured to provide a first power supply voltage; a second power supply pad configured to provide a second power supply voltage, which is less than the first power supply voltage; circuitry coupled to the first and second power supply pads, configured to be powered by the first power supply voltage; and a power pad handling circuit. The power pad handling circuit includes a selectively enablable pull-down path coupled between the first power supply pad and the second power supply pad; a storage circuit configured to store a pull-down path enable bit; a clock input coupled to receive a boot clock; and an asynchronous input coupled to receive a power-on-reset (POR) signal. The power pad handling circuit is configured to, in response to assertion of the POR signal, enable the selectively enablable pull-down path from the first power supply pad to the second power supply pad, regardless of any signal received at the clock input and regardless the value of the pull-down path enable bit; and, when reset has completed, provide a value of the pull-down path enable bit upon an active edge of the boot clock, wherein the value of the pull-down path enable bit selectively enables the selectively enablable pull-down path. In one aspect of the above embodiment, after completion of the reset, the POR signal is negated, the boot clock is running, and the storage circuitry is readable. In another aspect, the power pad handling circuit includes a flip flop having a synchronous input coupled to receive the pull-down path enable bit, an asynchronous input coupled to receive the POR signal, a clock input coupled to receive the boot clock, and an output coupled to selectively enable the selectively enablable pull-down path. In a further aspect, when the output of the flip flop has a first value, the selectively enablable pull-down path is enabled, and when the output of the flip flop has a second value, the selectively enablable pull-down path is disabled such that the first power supply pad provides the first power supply voltage to power the circuitry. In another aspect of the above embodiment, a first value of the pull-down path enable bit indicates a first package configuration and a second value of the pull-down path enable bit indicates a second package configuration. In a further aspect, the value of the pull-down path enable bit selectively enables the selectively enablable pull-down path during normal operation, such that when the pull-down path enable bit has the first value, the selectively enablable pull-down path is enabled, and when the pull-down path enable bit has the second value, the selectively enablable pull-down path is disabled. In yet a further aspect, in the first package configuration, the first power supply pad is not bonded to any external power supply pin of the packaged die, and in the second package configuration, the first power supply pad is bonded to a corresponding external power supply pin of the packaged die. In another aspect of the above embodiment, the selectively enablable pull-down path includes a resistive element having a first terminal and a second terminal, wherein the second terminal is connected to the second power supply pad; and a switch coupled between the first power supply pad and the first terminal of the resistive element, wherein when the switch is in a conductive state, the selectively enablable pull-down path is enabled, and when the switch is in a non-conductive state, the selectively enablable pull-down path is disabled. In another aspect, a portion of the power pad handling circuit, including the storage circuit, is located in a switchable voltage domain of the packaged die, and the power pad handling circuit further includes a latch circuit located in an always-on power domain of the packaged die, wherein the latch circuit is configured to latch the value of the package decode bit during normal operation and configured to provide the latched value of the package decode bit to selectively enable the selectively enablable pull-down path during a low power mode over a duration during which a power supply voltage of the switchable voltage domain is off.

In another embodiment, a packaged die includes a first power supply pad configured to provide a first power supply voltage; a second power supply pad configured to provide a second power supply voltage, which is less than the first power supply voltage; circuitry coupled to the first and second power supply pads, configured to be powered by the first power supply voltage; a switchable pull-down path coupled between the first power supply pad and the second power supply pad, the switchable pull-down path comprising a switch wherein the switchable pull-down path is configured to be enabled when the switch is a conductive state and disabled when the switch is in a non-conductive state; a storage circuit configured to store a pull-down path enable bit; a flip flop having a synchronous input coupled to receive the pull-down path enable bit, a clock input coupled to receive a boot clock; an asynchronous input coupled to receive a power-on-reset (POR) signal, and an output; and a latch having a data input coupled to the output of the flip flop, a control input coupled to receive an isolation enable signal which is asserted during operation in a low power mode, and an output coupled to a control input of the switch to control whether the switch is placed in the conductive or non-conductive state. In one aspect of the another embodiment, during normal operation, the flip flop is configured to, with the POR signal negated, propagate a value of the pull-down path enable bit at the input of the flip flop to the output of the flip flop in response to an active edge of the boot clock. In a further aspect, the flip flop is configured to, in response to assertion of the POR signal at the asynchronous input, set the output of the flip flop to a predetermined value which enables the switchable pull-down path, regardless of any signal received at the clock input and regardless of any value at the input of the flip flop. In another aspect, the latch is configured to, when the isolation enable signal is negated, latch a value at the output of the flip flop to provide to the control input of the switch, and, when the isolation enable signal is asserted, provide a previously latched value from the output of the flip flop to the control input of the switch, regardless of the value at the output of the flip flop. In a further aspect, the previously latched value is a latched value latched from the output of the flip flop during normal operation. In another aspect of the another embodiment, a first value of the pull-down path enable bit indicates a first package configuration and a second value of the pull-down path enable bit indicates a second package configuration. In a further aspect, during normal operation, with the POR signal negated and the isolation enable signal negated, a value of the pull-down path enable bit is latched by the latch so as to control the switch, wherein the first value of the pull-down path enable bit results in the latch placing the switch in the conductive state, and the second value of the pull-down path enable bit results in the latch placing the switch in the non-conductive state. In yet a further aspect, in the first package configuration, the first power supply pad is not bonded to any external power supply pin of the packaged die, and in the second package configuration, the first power supply pad is bonded to a corresponding external power supply pin of the packaged die. In an other aspect of the another embodiment, the storage circuit and flip flop are in a switchable voltage domain whose power supply is off during the low power mode and on during normal mode, and the latch is in an always-on power domain whose power supply is on during both the low power mode and the normal mode.

In yet another embodiment, a packaged die, having a package and a die, includes a plurality of power supply pads in a pad ring of the die, each electrically connected to a corresponding external power supply pin of the package, wherein each power supply pad corresponds to an interface segment of the pad ring representing a different type of input/output (I/P) interface; storage circuitry storing a plurality of pull-down path enable bits; a plurality of flip flops, each flip flop having a data input coupled to receive a corresponding pull-down path enable bit of the plurality of pull-down path enable bits; and a plurality of selectively enablable pull-down paths, wherein each selectively enablable pull-down path is coupled between a corresponding power supply pad of a corresponding interface segment and a ground node, and is coupled to receive the corresponding pull-down path enable bit from an output of a corresponding flip flop of the plurality of flip flops. Each of the plurality of selectively enablable pull-down paths is configured to, based on a value of the corresponding enable bit, either enable or disable the selectively enablable pull-down path between the corresponding power supply pad and the ground pad. In a further aspect of the yet another embodiment, for each of the plurality of selectively enablable pull-down paths, when the corresponding enable bit has a first value, a switch of the selectively enablable pull-down path is in a conductive state such that the corresponding power supply path is electrically connected to the ground node via a resistive element, and, when the corresponding enable bit has a second value, the switch of the selectively enablable pull-down path is in a non-conductive state such that the corresponding power supply path is not electrically connected to the ground node via the resistive element.

What is claimed is:

1. A packaged die comprising:
   a first power supply pad configured to provide a first power supply voltage;
   a second power supply pad configured to provide a second power supply voltage, which is less than the first power supply voltage;
   circuitry coupled to the first and second power supply pads, configured to be powered by the first power supply voltage; and
   a power pad handling circuit comprising:
      a selectively enablable pull-down path coupled between the first power supply pad and the second power supply pad;
      a storage circuit configured to store a pull-down path enable bit;
      a clock input coupled to receive a boot clock; and
      an asynchronous input coupled to receive a power-on-reset (POR) signal,
      wherein the power pad handling circuit configured to:
         in response to assertion of the POR signal, enable the selectively enablable pull-down path from the first power supply pad to the second power supply pad, regardless of any signal received at the clock input and regardless the value of the pull-down path enable bit; and
         when reset has completed, provide a value of the pull-down path enable bit upon an active edge of the boot clock, wherein the value of the pull-down path enable bit selectively enables the selectively enablable pull-down path.

2. The packaged die of claim 1, wherein after completion of the reset, the POR signal is negated, the boot clock is running, and the storage circuitry is readable.

3. The packaged die of claim 1, wherein the power pad handling circuit comprises:
   a flip flop having a synchronous input coupled to receive the pull-down path enable bit, an asynchronous input coupled to receive the POR signal, a clock input coupled to receive the boot clock, and an output coupled to selectively enable the selectively enablable pull-down path.

4. The packaged die of claim 3, wherein when the output of the flip flop has a first value, the selectively enablable pull-down path is enabled, and when the output of the flip flop has a second value, the selectively enablable pull-down path is disabled such that the first power supply pad provides the first power supply voltage to power the circuitry.

5. The packaged die of claim 1, wherein a first value of the pull-down path enable bit indicates a first package configuration and a second value of the pull-down path enable bit indicates a second package configuration.

6. The packaged die of claim 5, wherein the value of the pull-down path enable bit selectively enables the selectively enablable pull-down path during normal operation, such that:
    when the pull-down path enable bit has the first value, the selectively enablable pull-down path is enabled, and
    when the pull-down path enable bit has the second value, the selectively enablable pull-down path is disabled.

7. The packaged die of claim 6, wherein, in the first package configuration, the first power supply pad is not bonded to any external power supply pin of the packaged die, and in the second package configuration, the first power supply pad is bonded to a corresponding external power supply pin of the packaged die.

8. The packaged die of claim 1, wherein the selectively enablable pull-down path comprises:
    a resistive element having a first terminal and a second terminal, wherein the second terminal is connected to the second power supply pad; and
    a switch coupled between the first power supply pad and the first terminal of the resistive element, wherein when the switch is in a conductive state, the selectively enablable pull-down path is enabled, and when the switch is in a non-conductive state, the selectively enablable pull-down path is disabled.

9. The packaged die of claim 1, wherein a portion of the power pad handling circuit, including the storage circuit, is located in a switchable voltage domain of the packaged die, and the power pad handling circuit further comprises:
    a latch circuit located in an always-on power domain of the packaged die, wherein the latch circuit is configured to latch the value of the package decode bit during normal operation and configured to provide the latched value of the package decode bit to selectively enable the selectively enablable pull-down path during a low power mode over a duration during which a power supply voltage of the switchable voltage domain is off.

10. A packaged die comprising:
    a first power supply pad configured to provide a first power supply voltage;
    a second power supply pad configured to provide a second power supply voltage, which is less than the first power supply voltage;
    circuitry coupled to the first and second power supply pads, configured to be powered by the first power supply voltage;
    a switchable pull-down path coupled between the first power supply pad and the second power supply pad, the switchable pull-down path comprising a switch wherein the switchable pull-down path is configured to be enabled when the switch is a conductive state and disabled when the switch is in a non-conductive state;
    a storage circuit configured to store a pull-down path enable bit;
    a flip flop having a synchronous input coupled to receive the pull-down path enable bit, a clock input coupled to receive a boot clock; an asynchronous input coupled to receive a power-on-reset (POR) signal, and an output; and
    a latch having a data input coupled to the output of the flip flop, a control input coupled to receive an isolation enable signal which is asserted during operation in a low power mode, and an output coupled to a control input of the switch to control whether the switch is placed in the conductive or non-conductive state.

11. The packaged die of claim 10, wherein, during normal operation, the flip flop is configured to, with the POR signal negated, propagate a value of the pull-down path enable bit at the input of the flip flop to the output of the flip flop in response to an active edge of the boot clock.

12. The packaged die of claim 11, wherein the flip flop is configured to, in response to assertion of the POR signal at the asynchronous input, set the output of the flip flop to a predetermined value which enables the switchable pull-down path, regardless of any signal received at the clock input and regardless of any value at the input of the flip flop.

13. The packaged die of claim 10, wherein the latch is configured to:
    when the isolation enable signal is negated, latch a value at the output of the flip flop to provide to the control input of the switch, and
    when the isolation enable signal is asserted, provide a previously latched value from the output of the flip flop to the control input of the switch, regardless of the value at the output of the flip flop.

14. The packaged die of claim 13, wherein the previously latched value is a latched value latched from the output of the flip flop during normal operation.

15. The packaged die of claim 10, wherein a first value of the pull-down path enable bit indicates a first package configuration and a second value of the pull-down path enable bit indicates a second package configuration.

16. The packaged die of claim 15, wherein, during normal operation, with the POR signal negated and the isolation enable signal negated, a value of the pull-down path enable bit is latched by the latch so as to control the switch, wherein the first value of the pull-down path enable bit results in the latch placing the switch in the conductive state, and the second value of the pull-down path enable bit results in the latch placing the switch in the non-conductive state.

17. The packaged die of claim 16, wherein, in the first package configuration, the first power supply pad is not bonded to any external power supply pin of the packaged die, and in the second package configuration, the first power supply pad is bonded to a corresponding external power supply pin of the packaged die.

18. The packaged die of claim 10, wherein the storage circuit and flip flop are in a switchable voltage domain whose power supply is off during the low power mode and on during normal mode, and the latch is in an always-on power domain whose power supply is on during both the low power mode and the normal mode.

* * * * *